(12) United States Patent
Xu et al.

(10) Patent No.: US 7,410,912 B2
(45) Date of Patent: Aug. 12, 2008

(54) METHODS OF MANUFACTURING METAL OXIDE NANOWIRES

(75) Inventors: Chunhua Xu, Hong Kong (CN); San-Qiang Shi, Hong Kong (CN); Yang Liu, Hong Kong (CN); Chung Ho Woo, Hong Kong (CN)

(73) Assignee: The Hong Kong Polytechnic University, Hong Kong Sar (CN)

( * ) Notice: Subject to any disclaimer, the term of this patent is extended or adjusted under 35 U.S.C. 154(b) by 67 days.

(21) Appl. No.: 11/217,483

(22) Filed: Sep. 2, 2005

(65) Prior Publication Data
US 2007/0275567 A1 Nov. 29, 2007

(51) Int. Cl.
*H01L 21/31* (2006.01)
*H01L 21/469* (2006.01)

(52) U.S. Cl. .................. 438/773; 977/762; 977/811

(58) Field of Classification Search ............ 438/773; 977/762, 811
See application file for complete search history.

(56) References Cited

U.S. PATENT DOCUMENTS 2,531,535 A * 11/1950 Glover et al. ............ 148/282
6,781,166 B2 * 8/2004 Lieber et al. ............ 257/211
6,916,696 B1 * 7/2005 Buynoski ............ 438/200

OTHER PUBLICATIONS

Zheng Wei Pan et al., Nanobelts of Semiconducting Oxides, Science, Mar. 9, 2001, pp. 1947-1949, vol. 291.
Daihua Zhang et al., Detection of $NO_2$ down to ppb Levels Using Individual and Multiple $In_2O_3$ Nanowire Devices, Nano Lett., 2004, pp. 1919-1924, vol. 4, No. 10.
A. Kolmakov et al., Enhanced Gas Sensing by Individual $SnO_2$ Nanowires and Nanobelts Functionalized with Pd Catalyst Particles, Nano Lett. 2005, pp. 667-673, vol. 5, No. 4.

* cited by examiner

*Primary Examiner*—Michelle Estrada
*Assistant Examiner*—Nicholas J. Tobergte
(74) *Attorney, Agent, or Firm*—Buchanan Ingersoll & Rooney PC

(57) ABSTRACT

Metal oxide nanowires are being investigated to make nanodevices and nanosensors. High operation temperatures or vacuum is required in the manufacturing of metal oxide nanowires by existing vapor phase evaporation methods. This invention provides a method of manufacturing metal oxide nanowires by first providing a metal to form a non-linear substantially planar structure defining a surface. The metal is then heated and maintained at a temperature from 300 to 800° C., and then exposed to oxygen and water vapor containing air stream for a sufficient period of time to form the metal oxide nanowires. The oxygen containing air stream flows in a direction substantially parallel to the plane of the structure. Relatively low temperatures may be used and no vacuum is required in this method, thereby reducing the overall manufacturing costs. Further, this method is able to manufacture different densities of the metal oxide nanowires simultaneously.

20 Claims, 8 Drawing Sheets

METHODS OF MANUFACTURING METAL OXIDE NANOWIRES

FIELD OF THE INVENTION

This invention relates to manufacturing of nanowires, particularly those made of metal oxide.

BACKGROUND OF THE INVENTION

Metal oxide nanowires are being investigated to make nanodevices and nanosensors. For example, $In_2O_3$ and $SnO_2$ nanowires have been tested to form field-effect transistor gas sensors in recent year (D. H. Zhang, Z. Q. Liu, C. Li, T. Tamg, X. L. Liu, S. Han, B. Lei and C. W. Zhou, Nano Letters, 4 (2004) 1910; A. Kolmakov, D. O. Klenov, Y. Lilach, S. Stemmer and M. Moskovits, Nano Letters, 5 (2005) 667). This kind of gas sensors can detected ppb levels gases, such as $NO_2$, $NH_3$ est. In these researches, oxide nanowires are sonicated in a solution and little solution is dropped on substrates to make devices. Therefore, nanowires on devices show a random direction.

One of most popular methods to form oxide nanowires is vapor phase evaporation, which includes: heating the oxide powder to an evaporation temperature of the oxide powder for about 1 hour to about 2 hours at about 200 toor to about 400 torr in an atmosphere comprising argon; evaporating the oxide powder; and forming the oxide nanowires on a substrate (Z. L. Wang, Z. W. Pan, and Z. R. Dai, US Patent 2002/0094450 A1; Z. W. Pan, Z. R. Dai and Z. L. Wang, Science, 291 (2001) 1947). In order to evaporate oxide powders, heating temperature is usually set up to close to melting point of the oxide, for example 1000° C. The growth of oxide nanowires via vapor evaporation often involves a catalyst. A catalyst nanoparticle may present at one end of nanowire, which may affect the properties of the nanowire. A vacuum system is also required to maintain the pressure in a furnace. As high temperatures and vacuum is required for this method, the operation cost is also relatively high.

Another method of synthesis of oxide nanowire is thermal oxidation of a metal. It was shown that CuO nanowires could be formed on Cu foil by thermal oxidation in air. The formation of nanowires is mainly based on samples with small sizes. Generally, furnace temperature in the method of thermal oxidation (about 400-600° C.) is lower than that in vapor phase evaporation (over 1000° C.). Gas pressure in a furnace can keep 1 atm or lower. However, the length of nanowires formed by thermal oxidation is usually not uniform with low densities of nanowires.

Moreover, oxide nanowires formed by vapor phase evaporation or thermal oxidation often show a bending shape. Nanowire has a single crystal structure with spatial orientation. The bending structure of nanowire implies defects in the structures in nanowires.

OBJECTS OF THE INVENTION

Therefore, it is an object of this invention to resolve at least one or more of the problems as set forth in the prior art. As a minimum, it is an object of this invention to provide the public with a useful choice.

SUMMARY OF THE INVENTION

Accordingly, this invention provides a method of manufacturing metal oxide nanowires including the steps of:

providing a metal to form a non-linear substantially planar structure defining a surface;
heating and maintaining the metal at a temperature from 300 to 800° C.; and
exposing the metal to oxygen and water vapor containing air stream for a sufficient period of time to form the metal oxide nanowires, wherein the oxygen containing air stream flows in a direction substantially parallel to the plane of the structure.

The non-linear substantially planar structure may be substantially circular or triangular.

Preferably, the metal is copper. More preferably, the metal is exposed to the oxygen and water vapor containing air stream for 0.5 to 16 hours.

Alternatively, the metal is steel.

Optionally, the metal is zinc. More preferably, the metal is heated and maintained at a temperature from 250 to 390° C. The wire may be exposed to the oxygen and water vapor containing air stream for 3 to 50 hours.

Preferably, the oxygen and water vapor containing air stream flows at a rate of at least 10 mL/min, or more preferably at least 300 mL/min.

BRIEF DESCRIPTION OF THE DRAWINGS

Preferred embodiments of the present invention will now be explained by way of example and with reference to the accompanying drawings in which.

DETAILED DESCRIPTION OF THE PREFERRED EMBODIMENT

This invention is now described by way of example with reference to the figures in the following paragraphs.

Objects, features, and aspects of the present invention are disclosed in or are obvious from the following description. It is to be understood by one of ordinary skilled in the art that the present discussion is a description of exemplary embodiments only, and is not intended as limiting the broader aspects of the present invention, which broader aspects are embodied in the exemplary constructions.

Figure 1A:
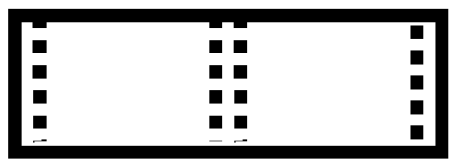
FIG. 1 shows the (a) top view and (b) front view of the specimen.
Figure 1B:
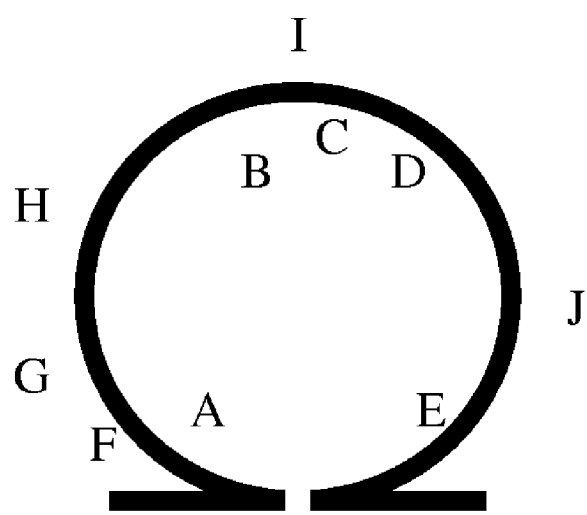
Figure 2A:
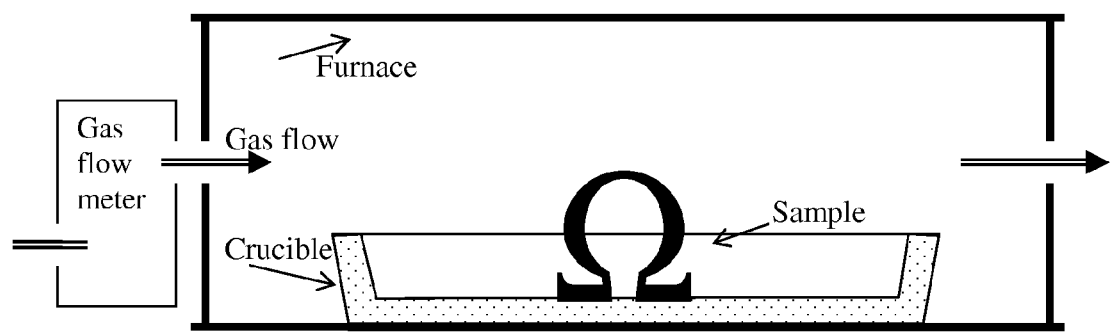
FIG. 2 shows (a) the specimen on an alumina crucible oxidized in a tube furnace with the flowing gas and (b) formation of "wet" air by passing dry air through a water container.

According to the method of this invention, a metal wire or foil is first formed a substantially non-linear planar structure, as in FIG. 1. Various shapes are possible including circular or triangular. The wire is then exposed to an oxygen containing air stream for a sufficient period of time to form the metal oxide nanowires. The oxygen containing air stream flows in a direction substantially parallel to the plane of the structure, as shown in FIG. 2(a). Of course, it is not necessary to have the air flowing in a direction absolutely parallel to the plane of the structure. It may be sufficient to have the oxygen-containing air flow in a direction such that there is a component parallel to the structure.

It is found that the nanowires may not form if the oxygen containing air stream flows at a rate lower than 10 mL/min. More metal oxide nanowires may be formed at a flow rate larger than 300 mL/min or 0.3 L/min.

To form the metal oxide nanowires, the metal wire or foil may be heated and maintained at about 300 to 800° C. under the flow of the oxygen containing air stream. Exposing the wire to oxygen containing air stream for 0.5 to 16 hours may allow sufficient metal oxide nanowires to form.

Various metals may be used, including copper, steel and zinc. In this context, the term "metal wire or foil" may include pure metal and metal alloy wire or foil.

EXAMPLE

Specimens are prepared with commercial Cu foils with the size of about 35×3×0.1 mm (purity: 99.9% Cu) in the present experiment. The pieces of Cu foils are made as Ω shape, as illustrated in FIG. 1 (The capital letters in FIG. 1(b) refer to the local positions of specimens). Specimens are, then, washed in aqueous solution of 1.5 M HCl for 1 min, rinsed in deionized water, and then dried in nitrogen, before oxidized in a LINDBERG tube furnace with diameter of 52 mm and length of 850 mm. Different metal will require different cleansing technique, which may be obtained from literature.

Figure 2B:
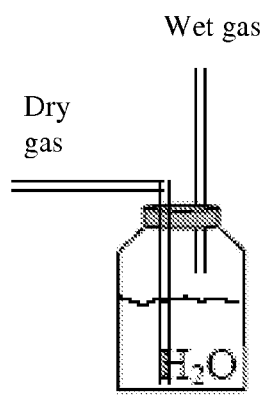

The specimens in FIG. 1 on an alumna crucible are held at 400 to 700° C. for 0.5 to 16 hours under the flow of wet compressed-air at a pressure of 1 atm, as shown in FIG. 2(a). Wet air is formed by compressed-air (here it is called as dry air) through a water container as shown in FIG. 2(b). The inlet airflow rate is measured by a Platon airflow meter. Morphologies of oxidized specimens are characterized by a scanning electron microscope (STEREO SCAN 440). The airflow field around specimens is simulated by a 3D CFD solver (Fluent) which have been proved an effective tool to simulate the 3D flow.

The morphologies of oxide nanowires formed after oxidation change much at different positions of 'Ω' shape specimens. FIG. 3 shows the morphologies of oxide nanowires on the specimens after oxidation in inlet airflow rate of 0.8 L/min at 500° C. for 4 hours. FIGS. 3(a)-3(e) shows the morphologies on the inner side of the oxidized specimens at the positions A-E in FIG. 1(b), respectively. High density of uniform aligned nanowires is formed at position C. The density of nanowires at position D is lowest on the inner side of the specimens. Similarly, the morphologies of nanowires are shown in FIGS. 3(f)-3(j) corresponding to positions F-J on the outer side in FIG. 1(b), respectively. The density of nanowires on the outer side of specimens is significantly lower than that on the inside. The method of this invention is able to form different densities of nanowires at the same time, particularly high densities of aligned metal oxide nanowires.

Figure 4A:
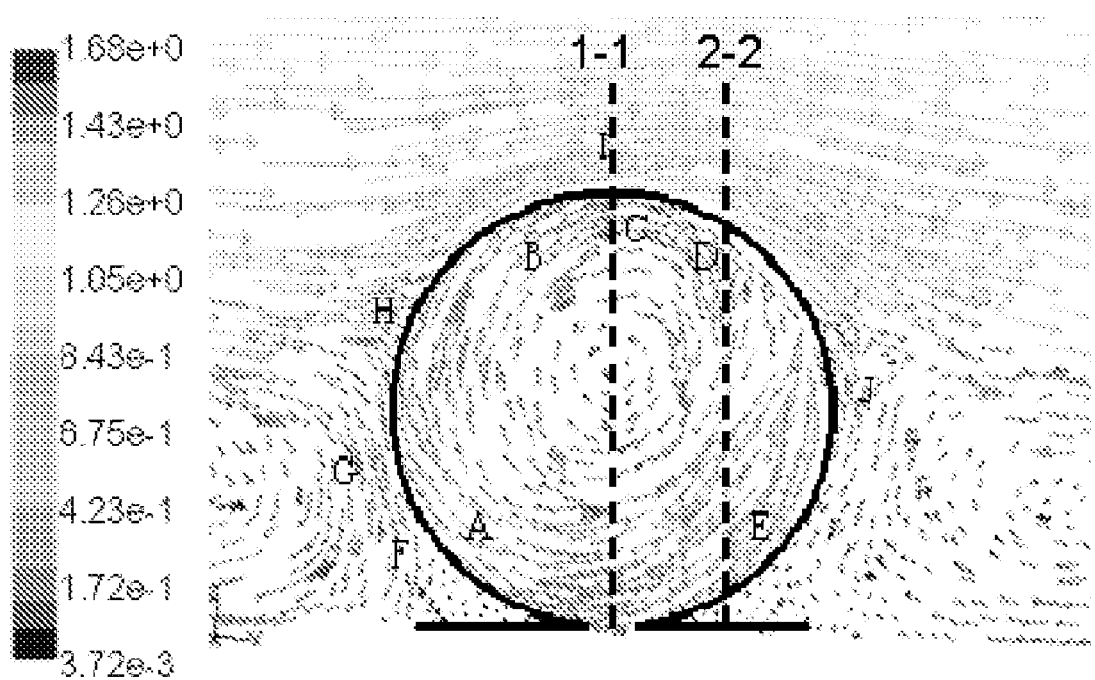
FIG. 4 shows computer simulations of local gas flow through the sample, (a) front view, (b) cross section along the line 1-1 in (a) (side view) and (c) cross section along the line 2-2 in (a) (side view)

A 3D CFD flow simulation was performed to show the gas-flow distribution around the specimens in FIG. 4. The boundary conditions are the same as those of experiments, and the inlet flow rate is set to be 1.0 L/min, which is similar to the experiment. The airflow vectors around the middle section of the specimen are shown in FIG. 4(a) (front view). FIG. 1(b) is also put on FIG. 4(a) to assist in identifying the relation between local airflows and morphologies at the positions of a specimen.

Figure 3A:
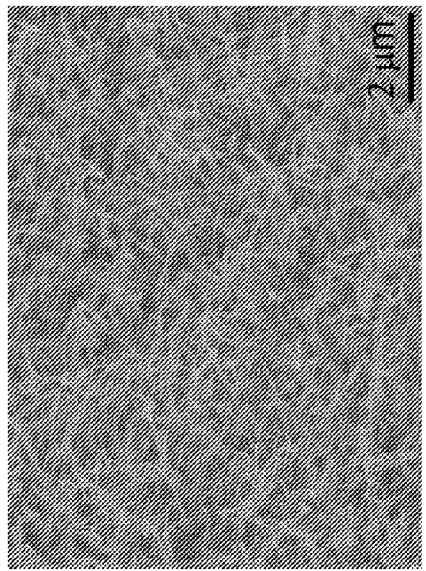
FIG. 3 shows the morphologies of nanowires formed on specimens after oxidation in wet air with gas flow rate of 0.8 L/min at 500° C. for 4 hours.
Figure 3B:
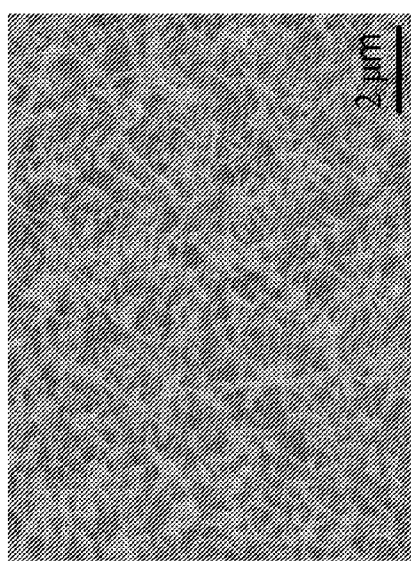
Figure 3C:
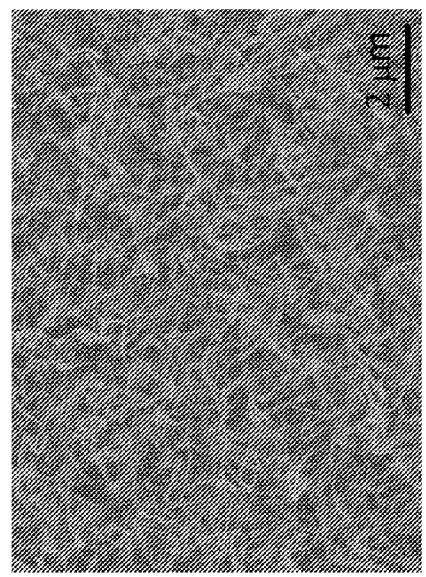
Figure 3D:
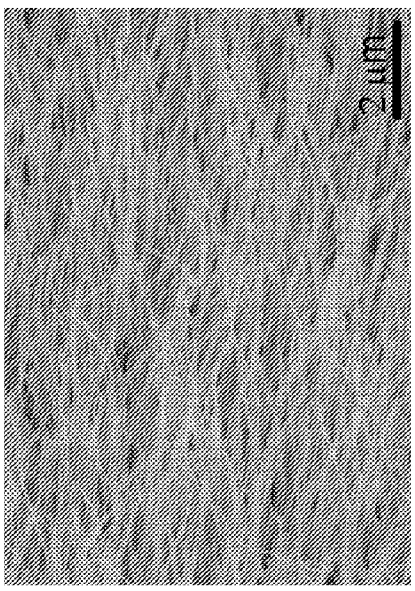
Figure 3E:
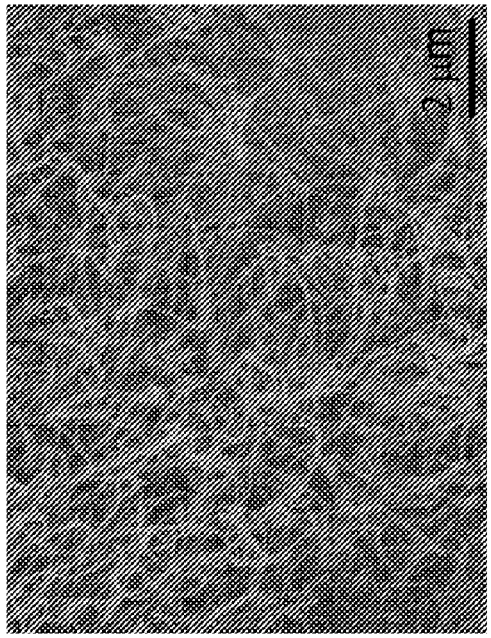
Figure 3F:
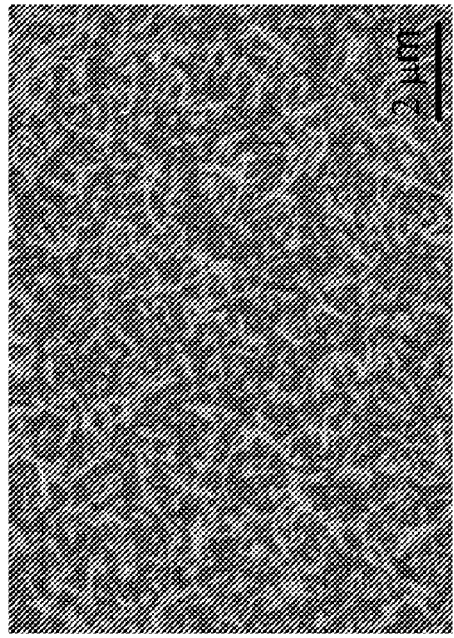
Figure 3G:
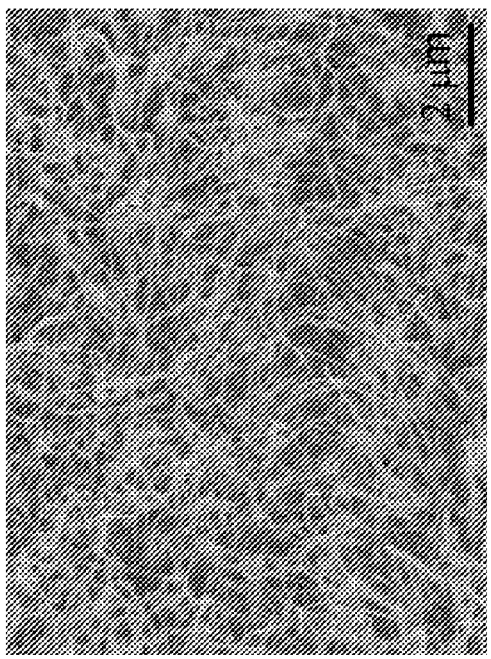
Figure 3H:
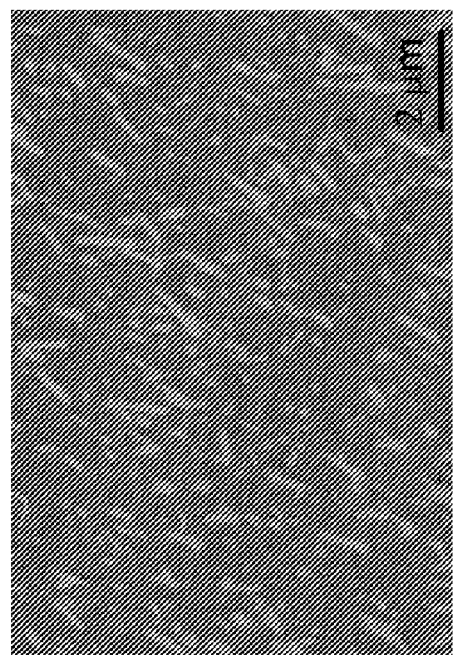
Figure 3I:
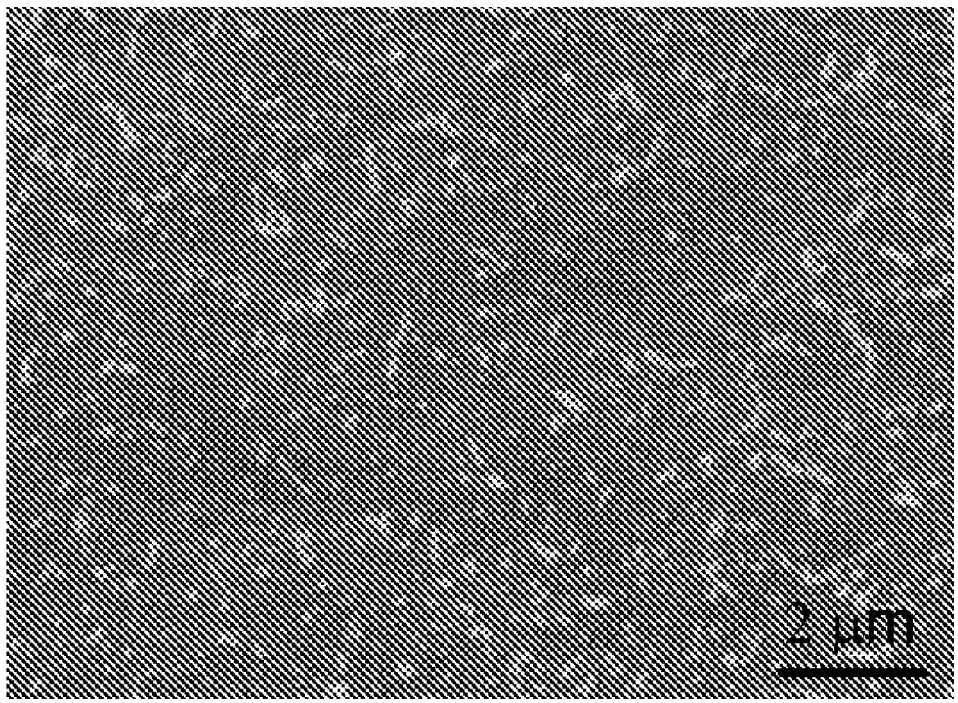
Figure 3J:
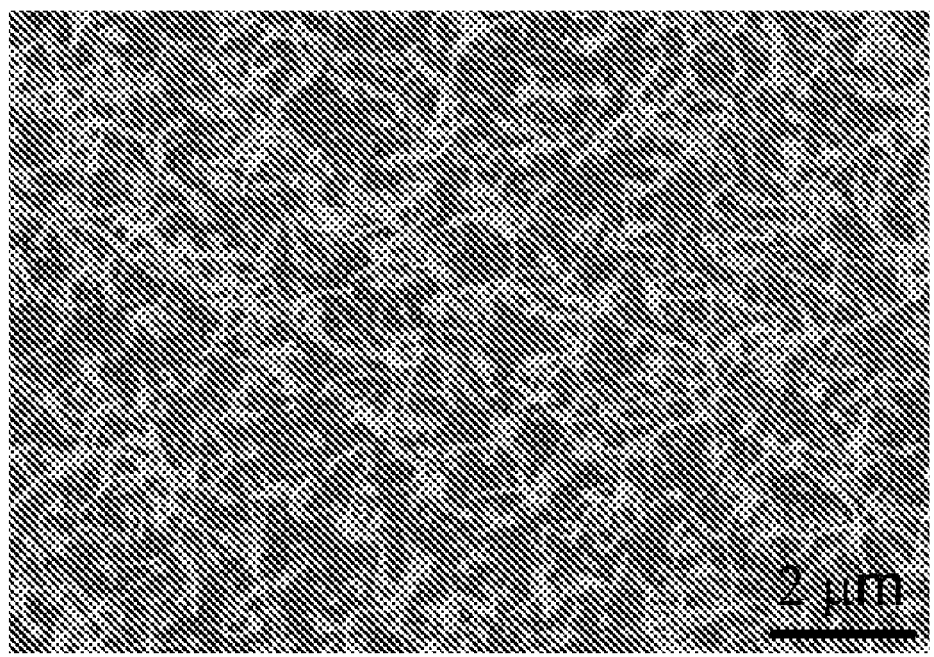

A vortex exists around the 'Ω' support. Local gas flow rates around the specimen can be evaluated from FIG. 4(a). When the air flows from the left hand side of the figure, the direction of local airflow on the inner side of specimens is clockwise as shown in FIG. 4(a). This follows with the trend of the nanowires growth along the direction of local airflow from FIGS. 3(a)-3(e). The local airflow is weak at the position C (about 0.05 mm/s) where high density of the uniform aligned nanowires is formed. The local air flow rates are about 1~4 nm/s at the positions of A-B and D-E, where the density of nanowires is little bit low. The local airflow on the outer side of the specimen is much more complex than that on the inner side. The direction of local airflow at position 'H' is towards the specimen surface, where low density of nonawires grows randomly, as shown in FIG. 3(h). Few nanowires are formed at the position I (FIG. 3(i)), where the local flow rate is highest, about 10 mm/s. Generally, the intensity of the local airflow at the position F is low and similar to that at position C from FIG. 4(a). After Comparing FIG. 3(f) with 3(c), it may be concluded that higher density of nanowires may form more easily at low local airflow.

Figure 4B:
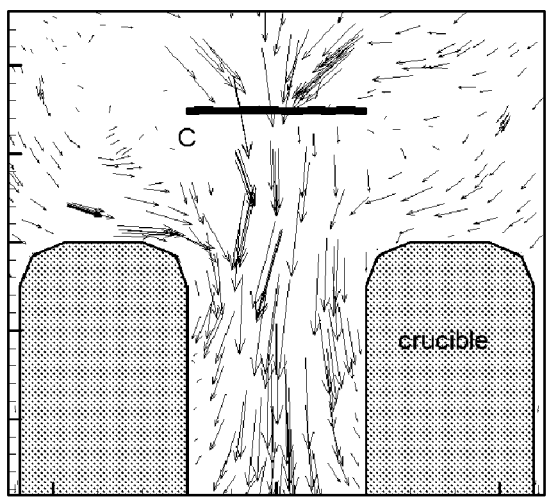
Figure 4C:
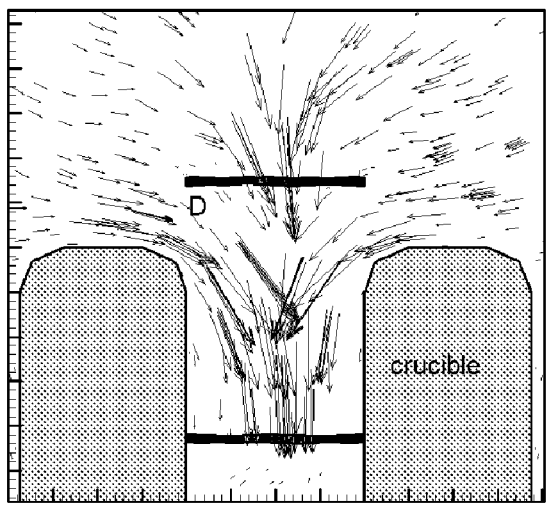

The simulation results of the local airflow along the cross section 1-1, including position C, and the cross section 2-2, including position D, (side view) are shown in FIGS. 4(b) and 4(c), respectively. The grey color blocks respect alumina crucible and horizontal heavy lines represent the specimen. The local airflow at position C in FIG. 4(b) is parallel, which may result in the forming of aligned nanowires at this position. The local air at position D in FIG. 4(c) intercepts with each other, which may cause the bending nanowires to be formed at this position. The direction of local gas flow may control the direction of growth of the nanowires.

Figure 5:
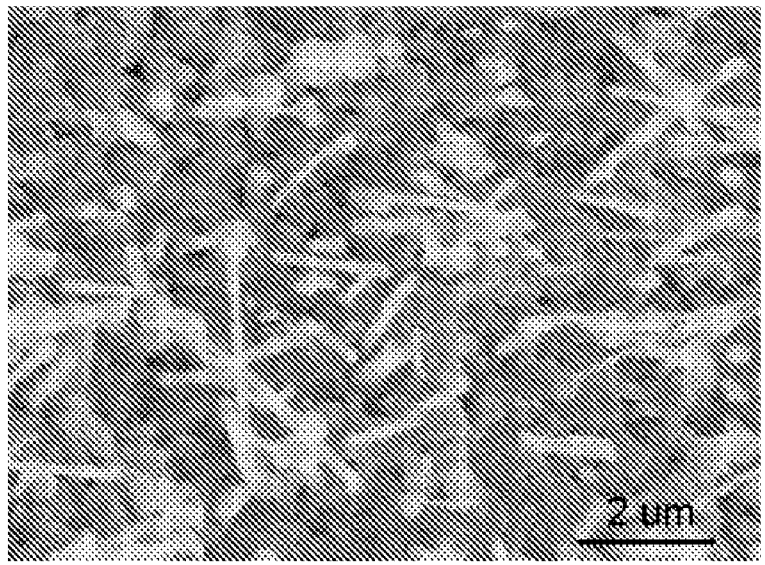
FIG. 5 shows the morphologies of nanowires formed at position C of the specimen after oxidation in wet air with gas flow rate of 0.15 L/min.
Figure 6:
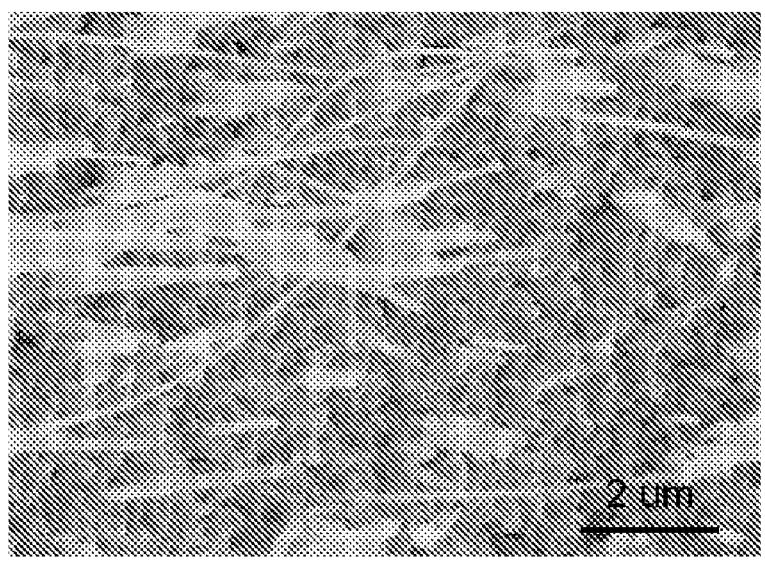
FIG. 6 shows the morphologies of nanowires formed position C of the specimen after oxidation in dry air with gas flow rate of 0.8 L/min.

In an attempt to obtain higher density of nanowires, the inlet airflow was decreased. FIG. 5 shows the surface of specimen (on the position C) oxidized in wet air at airflow rate of 0.15 L/min. The nanowires formed have lower densities and larger diameters comparing to that as shown in FIG. 3(c). This may be due to two possible reasons, although there is no confirmation at this stage: 1) low airflow rate and 2) low humidity in flow air. In order to identify the reasons, Cu foils with 'Ω' shape were oxidized in a tube furnace with dry compressed air at 1 atm. and airflow rate from 0.6 to 1.0 L/min at 500° C. for 4 hours. The density of the nanowires form is very low on whole specimens. FIG. 6 shows the morphology of the surface at the position C of the Cu specimen oxidized in dry air with flow rate of 0.8 L/min. Few nanowires can be formed. This result indicates that the presence of water vapor is important to the formation of Cu oxide nanowires during thermal oxidation.

In summary, a new method to form different densities of oxide nanowires, including uniform aligned metal oxide nanowires, on a specimen is devised in this invention. Based on the computer simulation, local airflow around the specimens may affect the morphologies of the nanowires significantly. The local gasflow rate affects the density of nanowires. The local gasflow direction affects the growth direction of nanowires. Water vapor in gas may be a catalyst to assist the growth of nanowires. Making metal piece into a non-linear planar structure may change the local airflow field around the specimens to synthesize high density of uniform aligned oxide nanowires.

In summary, a new method to form aligned metal oxide nanowires on a specimen is devised in this invention. Local airflow around the specimens may affect the morphologies of the nanowires significantly. Aligned nanowires may be formed by controlling the local airflow field. There is a trend of the nanowire growth along the direction of local airflow. As local airflow rate around specimens increases, the density of the nanowires formed decreases.

Further, relatively low temperatures may be used and no vacuum is required for the method of this invention. Therefore, the overall manufacturing costs may be reduced.

While the preferred embodiment of the present invention has been described in detail by the examples, it is apparent that modifications and adaptations of the present invention will occur to those skilled in the art. Furthermore, the embodiments of the present invention shall not be interpreted to be restricted by the examples or figures only. It is to be expressly understood, however, that such modifications and adaptations are within the scope of the present invention, as set forth in the following claims. For instance, features illustrated or described as part of one embodiment can be used on another embodiment to yield a still further embodiment. Thus, it is intended that the present invention cover such modifications and variations as come within the scope of the claims and their equivalents.

The invention claimed is:

1. A method of manufacturing metal oxide nanowires including the steps of:
    providing at least one elongate metal element in a form defining a substantially planar surface;
    heating and maintaining the metal at a temperature from 250 to 800° C.; and
    exposing the metal to oxygen and water vapor containing air stream for a predetermined time period capable of allowing formation of the metal oxide nanowires, wherein the oxygen containing air stream flows in a direction substantially parallel to the substantially planar surface,
    wherein the at least one elongate metal element is provided in a position irrespective and independent of any other elongate metal elements.

2. The method of claim 1, wherein the substantially planar surface is substantially circular in cross-section.

3. The method of claim 1, wherein the substantially planar surface is substantially triangular in cross-section.

4. The method of claim 1, wherein the elongate metal element is copper.

5. The method of claim 4, wherein the elongate metal element is exposed to the oxygen and water vapor containing air stream for 0.5 to 16 hours.

6. The method of claim 1, wherein the elongate metal element is zinc.

7. The method of claim 6, wherein the elongate metal element is heated and maintained at a temperature from 250 to 390° C.

8. The method of claim 6, wherein the elongate metal element is exposed to the oxygen and water vapor containing air stream for 3 to 50 hours.

9. The method of claim 1, wherein the oxygen and water vapor containing air stream flows at a rate of at least 10 mL/min.

10. The method of claim 9, wherein the oxygen and water vapor containing air stream flows at a rate of at least 300 mL/min.

11. A method of manufacturing metal oxide nanowires including the steps of:
    providing a metal element partially enclosing a shaped cross-section;
    heating and maintaining the metal element at a temperature from 250 to 800° C.; and
    exposing the metal element to oxygen and water vapor containing air stream for a predetermined time period capable of allowing formation of the metal oxide nanowires within an inner lumen portion of the metal element, wherein the oxygen and water vapor containing air stream flows in a direction substantially parallel to an outer surface of the metal element such that at least a portion of the air stream enters the inner lumen through an at least partially open portion of the metal element.

12. The method of claim 11, wherein providing the metal element comprises shaping the element in an omega-shape cross-sectional area.

13. The method of claim 12, wherein providing the metal element comprises shaping the metal element into a substantially circular shape cross-sectional area or a substantially triangular shape cross-sectional area.

14. The method of claim 12, wherein providing the metal element comprises shaping the metal element to include a discontinuous outer surface area and the at least partially open portion comprises an elongated space in a longitudinal direction on the metal element.

15. The method of claim 11, wherein the initial direction of air stream is directed toward an upper region of the metal element such that a vortex of the air stream is formed on an outer region of the metal element, and a local airflow within the element flows approximately orthogonally from the initial direction of the air stream.

16. The method of claim 15, wherein the local airflow within the metal element allows for relatively uniform aligned nanowires formed in an upper region within the element.

17. The method of claim 11, wherein the initial air stream is at least 10 mL/min.

18. A method of manufacturing metal oxide nanowires including the steps of:
    providing a tubular element with a longitudinal direction and a lumen cross-sectional area orthogonal to the longitudinal direction, wherein the lumen cross-sectional area comprises a partially enclosed area and an opening, and wherein the tubular element comprises metal;
    heating and maintaining the tubular element; and
    exposing the tubular element to a wet air stream directed toward an upper region on an outer surface of the tubular element in a direction orthogonal to the lumen to form relatively uniformly aligned nanowires within the lumen.

19. The method of claim 18, wherein the providing the tubular element comprises shaping the tubular element with a lumen partially enclosed cross-sectional area is omega-shaped, substantially circular shaped or substantially triangular shaped.

20. The method of claim 18, wherein the heating and maintaining the tubular element step includes heating the element to a temperature from 300 to 800° C.,
    wherein the exposing the tubular element includes flowing the wet air stream comprising oxygen and water vapor directed toward the upper region on the outer surface of the tubular element at a flow rate of at least 10 mL/min, and
    wherein the forming of the relatively uniformly aligned nanowires comprises forming uniformly aligned nanowires within the lumen in a discrete portion of the lumen away from an opening in the lumen cross-sectional area rather than in portions of the lumen adjacent to the opening in the lumen cross-sectional area.

* * * * *